(12) United States Patent
Kitagawa et al.

(10) Patent No.: US 12,363,923 B2
(45) Date of Patent: Jul. 15, 2025

(54) PASSIVE COMPONENT

(71) Applicant: Murata Manufacturing Co., Ltd., Kyoto-fu (JP)

(72) Inventors: Hisaki Kitagawa, Nagaokakyo (JP); Koshi Himeda, Nagaokakyo (JP); Jyou Kikura, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 17/527,129

(22) Filed: Nov. 15, 2021

(65) Prior Publication Data

US 2022/0157930 A1    May 19, 2022

(30) Foreign Application Priority Data

Nov. 16, 2020  (JP) .................................. 2020-190480

(51) Int. Cl.
*H10D 1/68* (2025.01)
*H10D 1/20* (2025.01)
*H10D 86/85* (2025.01)

(52) U.S. Cl.
CPC .............. *H10D 1/694* (2025.01); *H10D 1/20* (2025.01); *H10D 86/85* (2025.01)

(58) Field of Classification Search
CPC ........ H01L 27/013; H01L 28/65; H01L 28/40
See application file for complete search history.

(56) References Cited

U.S. PATENT DOCUMENTS

| | | | |
|---|---|---|---|
| 5,248,903 A * | 9/1993 | Heim .................. | G03F 7/70433 257/781 |
| 6,461,914 B1 | 10/2002 | Roberts et al. | |
| 6,921,689 B2 | 7/2005 | Matsuhashi | |
| 2003/0213990 A1* | 11/2003 | Tsai ...................... | H10B 12/00 257/E21.018 |
| 2004/0188748 A1* | 9/2004 | Matsuhashi ............. | H01L 28/60 257/E21.582 |
| 2004/0266029 A1* | 12/2004 | Jang ...................... | H10B 53/00 257/E21.244 |
| 2004/0266095 A1* | 12/2004 | Oh ......................... | H01L 28/55 257/E21.244 |

FOREIGN PATENT DOCUMENTS

| | | |
|---|---|---|
| CN | 1639861 A | 7/2005 |
| JP | 2002-009248 A | 1/2002 |
| JP | 2006-073850 A | 3/2006 |
| JP | 2018-534763 A | 11/2018 |
| TW | 201442254 A | 11/2014 |
| WO | 2019/167456 A1 | 9/2019 |

* cited by examiner

*Primary Examiner* — Tucker J Wright
(74) *Attorney, Agent, or Firm* — Studebaker Brackett PLLC

(57) ABSTRACT

A passive component includes a substrate having insulating properties and having a surface having a recess, a bottom electrode filling at least a portion of the recess, a dielectric film provided on a surface of the bottom electrode, and a top electrode opposite to the bottom electrode with the dielectric film interposed therebetween. In a height direction perpendicular to the surface of the substrate, a dimension of the bottom electrode is larger than a dimension of the dielectric film.

16 Claims, 14 Drawing Sheets

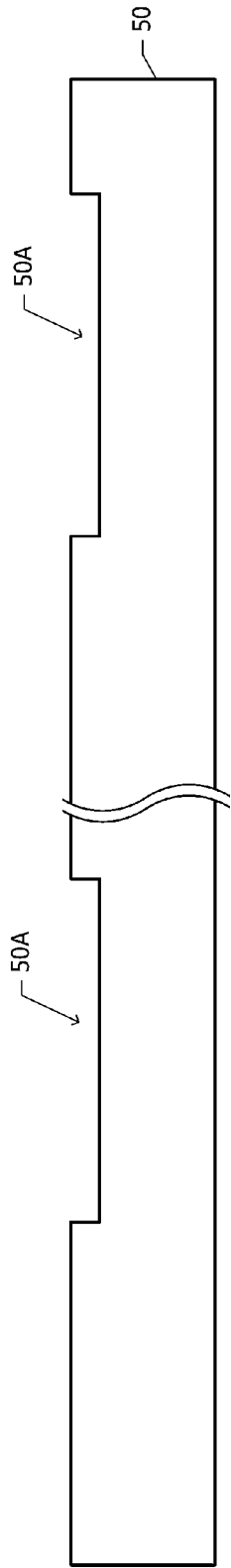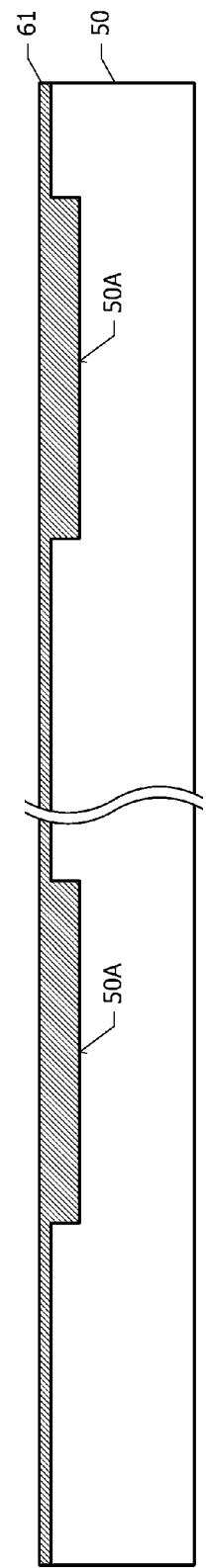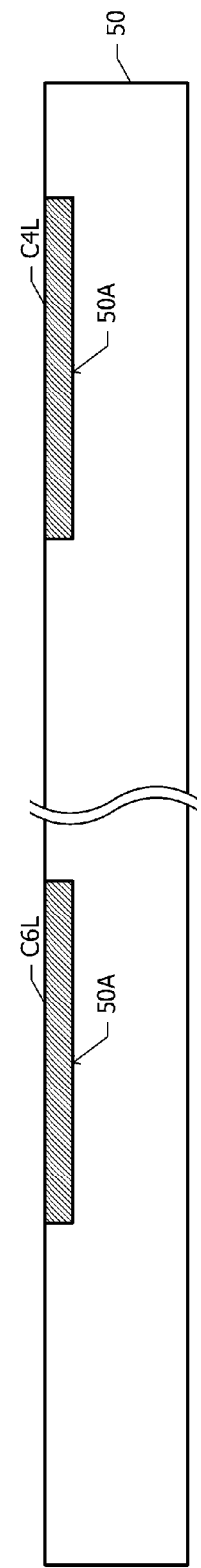

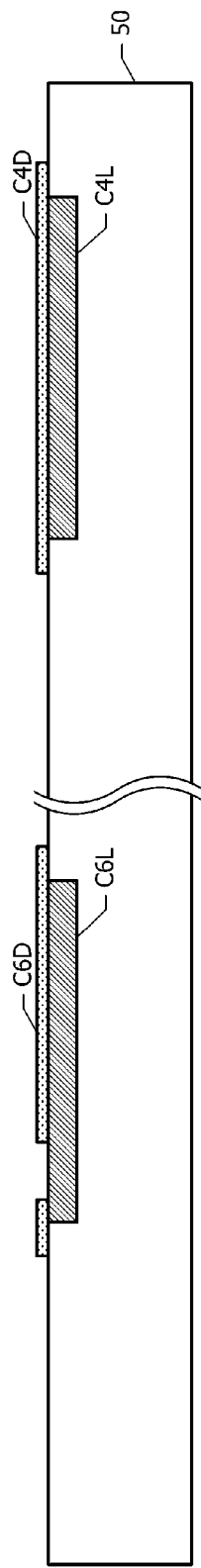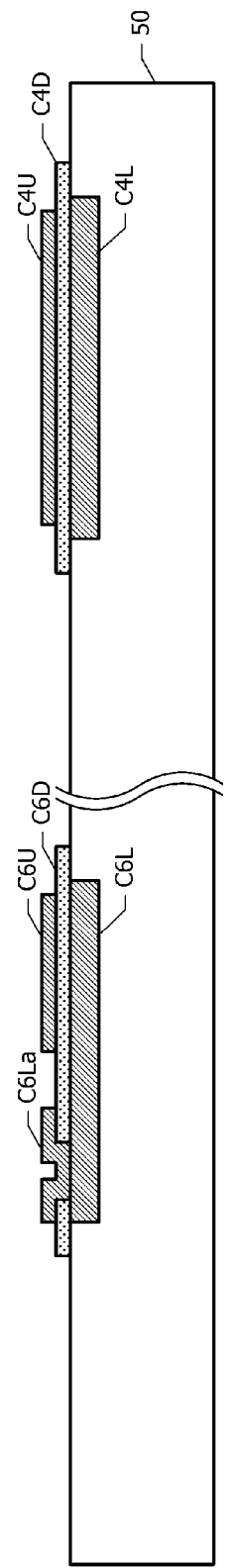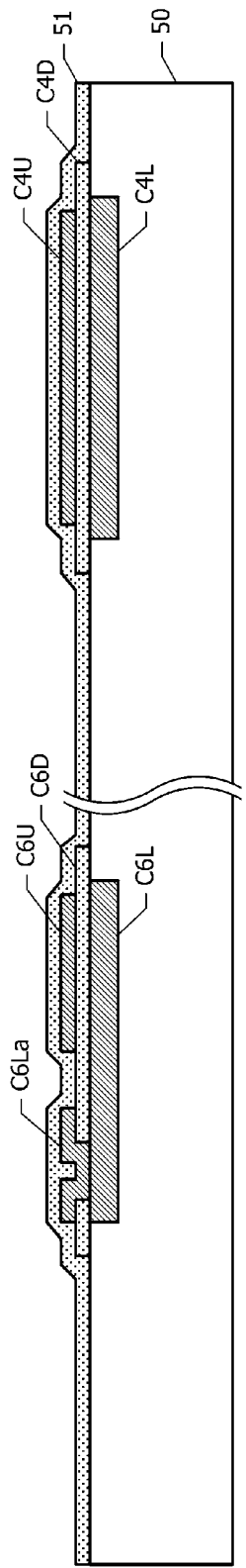

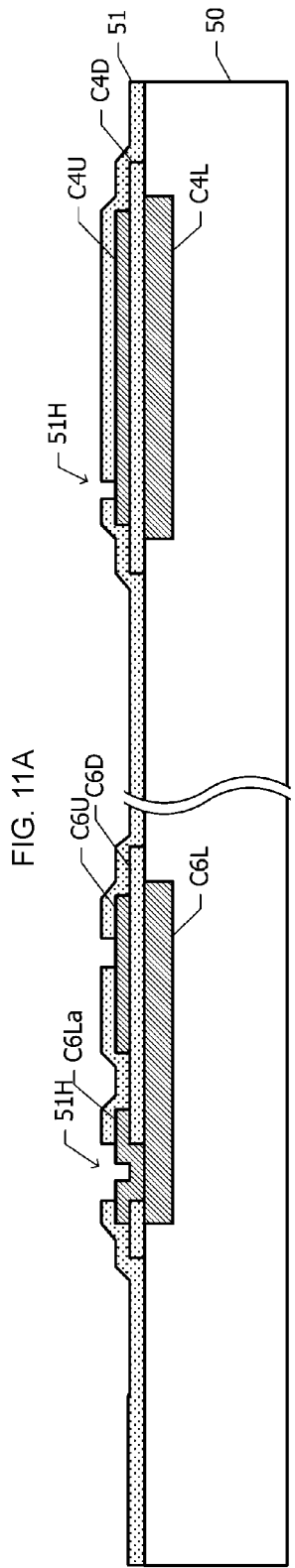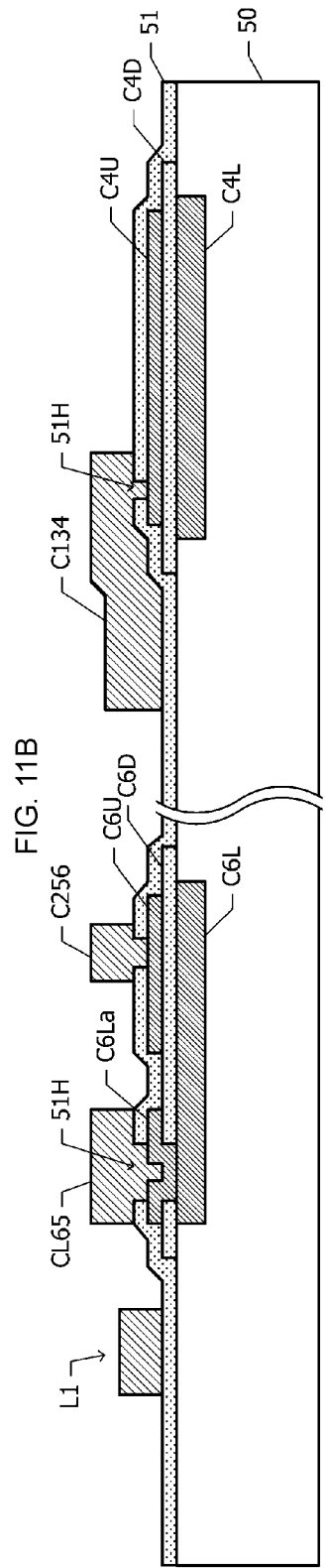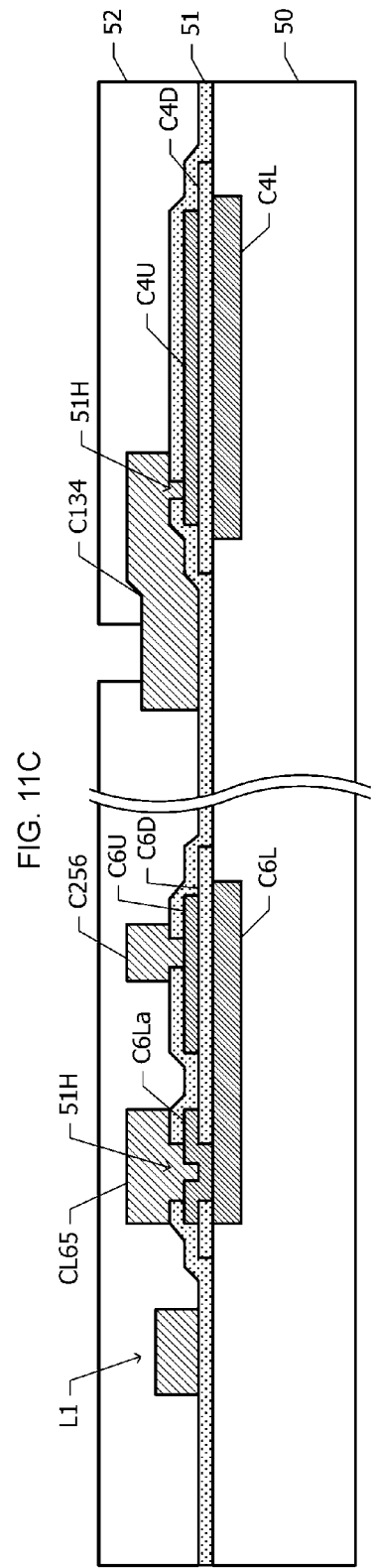

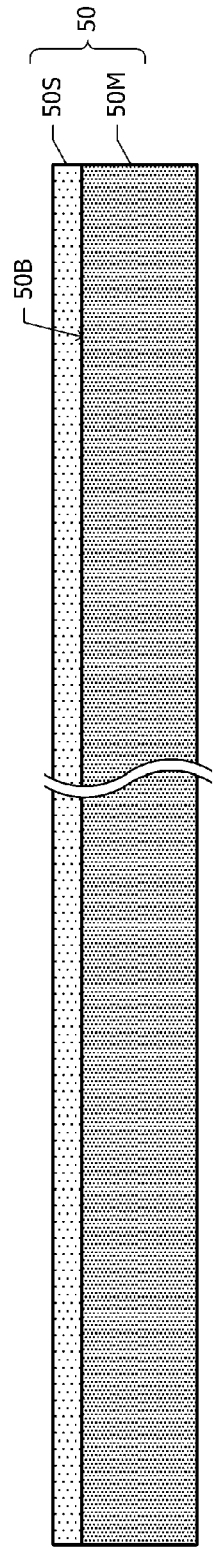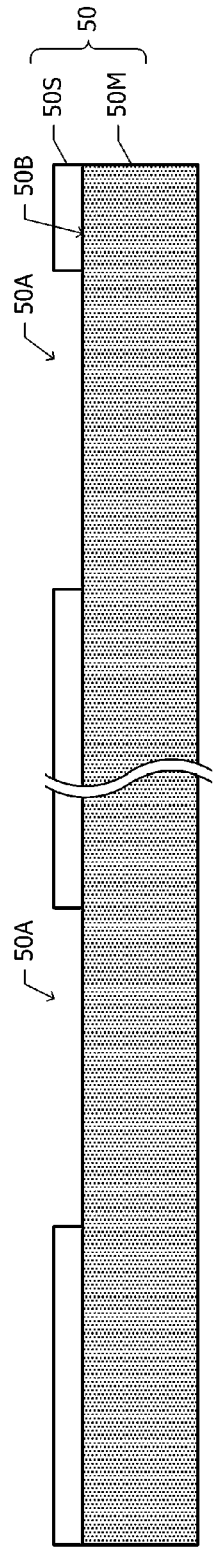

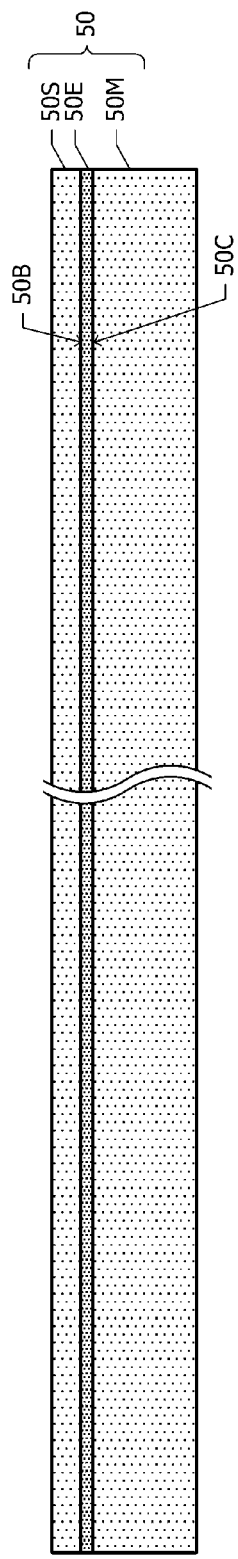
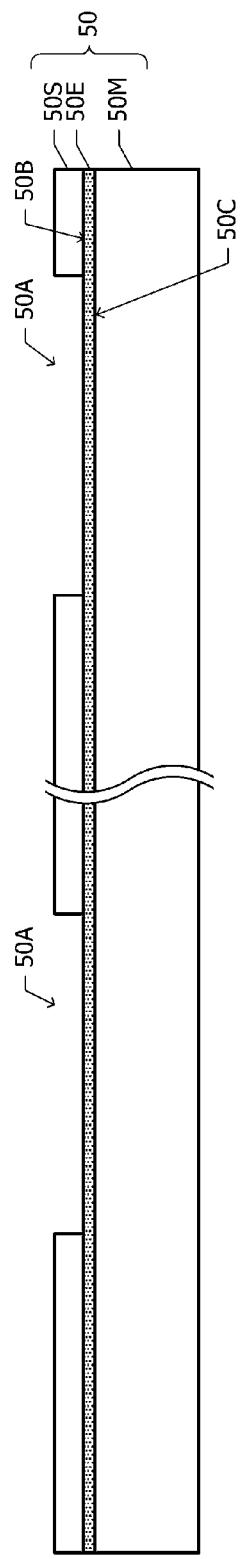

PASSIVE COMPONENT

CROSS-REFERENCE TO RELATED APPLICATION

This application claims benefit of priority to Japanese Patent Application No. 2020-190480, filed Nov. 16, 2020, the entire content of which is incorporated herein by reference.

BACKGROUND

Technical Field

The present disclosure relates to a passive component.

Background Art

With the rapid spread of electronic devices having wireless communication functions, an extremely large number of high-frequency bands have been increasingly used in wireless communications. It is desired to achieve, with a single communication module, communications performed by using multiple frequency bands (multiband) and communications based on multiple wireless communication standards (multimode). Regarding a component mounted on or in such a communication module supporting multiband and multimode, reduction in size and thickness and high integration have been advancing to suppress the communication module from being upsized.

To highly integrate plural components on or in a communication module, a technology such as three-dimensional mounting of the components or embedding the components into a package substrate is used. In addition, an integrated passive component such as a noise filter or a band-pass filter is also required, for example, to have reduced size and thickness and to be embedded into a package substrate.

To achieve such reduction in size and thickness of a component, a passive-on-glass (POG) device provided with a glass substrate and a capacitor is proposed (refer to Japanese Unexamined Patent Application Publication (Translation of PCT Application) No. 2018-534763). The device includes a bottom electrode disposed on the glass substrate, a dielectric film covering a surface of the bottom electrode, and a top electrode disposed on the dielectric film.

SUMMARY

When thermal load is applied to the capacitor having a structure disclosed in Japanese Unexamined Patent Application Publication (Translation of PCT Application) No. 2018-534763, thermal stress is generated due to a difference in coefficient of linear expansion between the bottom electrode and the dielectric film. Such thermal stress is concentrated particularly at an edge portion of the bottom electrode, and a portion of the dielectric film at the edge portion is thereby likely to have a crack. If the dielectric film has a crack, the electrostatic capacity of the capacitor varies. When the capacitor constitutes a filter, it is impossible to obtain desired filter characteristics because the resonance point of the filter is also caused to vary by the electrostatic capacity of the capacitor varying.

Accordingly, the present disclosure provides a passive component including a capacitor whose electrostatic capacity hardly varies under thermal stress.

According to an aspect of the present disclosure, a passive component includes a substrate having insulating properties and having a surface having a recess, a bottom electrode filling at least a portion of the recess, a dielectric film provided on a surface of the bottom electrode, and a top electrode opposite to the bottom electrode with the dielectric film interposed therebetween. In a height direction perpendicular to the surface of the substrate, a dimension of the bottom electrode is larger than a dimension of the dielectric film.

With the above-described configuration, the thermal stress applied to the dielectric film is reduced. As a result, variations in electrostatic capacity under the thermal stress is reduced.

Other features, elements, characteristics and advantages of the present disclosure will become more apparent from the following detailed description of preferred embodiments of the present disclosure (with reference to the attached drawings).

BRIEF DESCRIPTION OF THE DRAWINGS

FIGS. 9A, 9B, and 9C are sectional views of the passive component, in the middle of manufacturing, according to the second embodiment;

FIGS. 10A, 10B, and 10C are sectional views of the passive component, in the middle of manufacturing, according to the second embodiment;

FIGS. 11A, 11B, and 11C are sectional views of the passive component, in the middle of manufacturing, according to the second embodiment;

FIG. 12A is a sectional view of a substrate used for a passive component according to a third embodiment;

FIG. 12B is a sectional view of the substrate when a recess is formed in the substrate;

FIG. 13A is a sectional view of a substrate used for a passive component according to a fourth embodiment;

FIG. 13B is a sectional view of the substrate when a recess is formed in the substrate.

DETAILED DESCRIPTION

First Embodiment

A passive component according to a first embodiment will be described with reference to FIGS. 1A, 1B, and 1C.

Figure 1A:
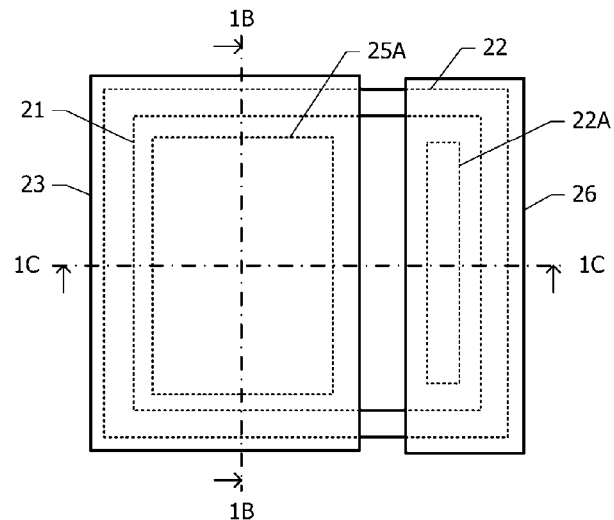
FIG. 1A is a plan view of a passive component according to a first embodiment.
Figure 1B:
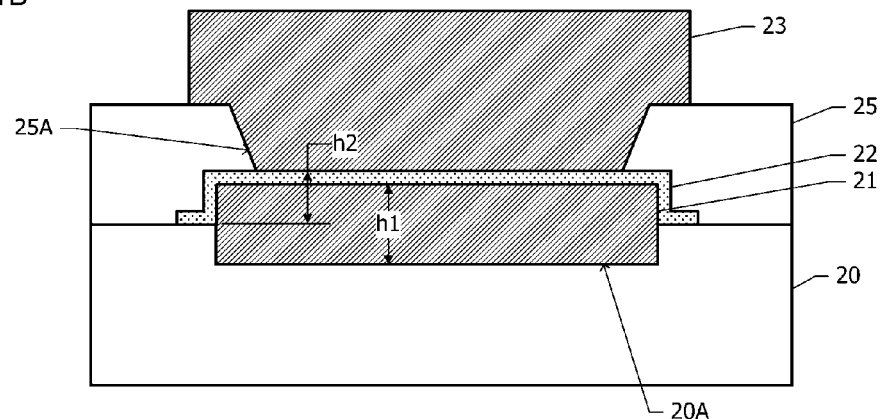
FIG. 1B is a sectional view taken along dot-and-dash line 1B-1B in FIG. 1A.
Figure 1C:
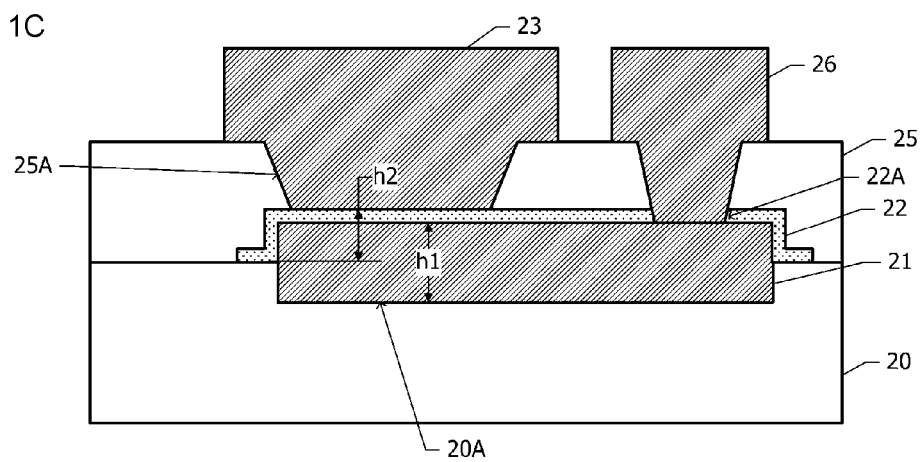
FIG. 1C is a sectional view taken along dot-and-dash line 1C-1C in FIG. 1A.

FIG. 1A is a plan view of the passive component according to the first embodiment. FIG. 1B is a sectional view taken along dot-and-dash line 1B-1B in FIG. 1A. FIG. 1C is a sectional view taken along dot-and-dash line 1C-1C in FIG. 1A. A recess 20A is formed in one surface of a substrate 20 having insulating properties. The surface having the recess 20A is referred to as an upper surface. The recess 20A is filled with a bottom electrode 21. The bottom electrode 21 protrudes above the upper surface of the substrate 20.

A dielectric film 22 covers the sides of a portion of the bottom electrode 21 positioned above the upper surface of the substrate 20 and covers the upper surface of the bottom electrode 21. The dielectric film 22 further covers a frame-shaped region of the upper surface of the substrate 20 surrounding the bottom electrode 21. In plan view, the bottom electrode 21 is disposed inside the contour line of the dielectric film 22.

An insulating film 25 covers the upper surface of the substrate 20 and the dielectric film 22. The insulating film 25 has a cavity 25A reaching the dielectric film 22. Moreover, the insulating film 25 and the dielectric film 22 have a cavity 22A reaching the bottom electrode 21. In plan view, the lower end of the cavity 25A and the lower end of the cavity 22A are positioned within the bottom electrode 21. A top electrode 23 is disposed in the cavity 25A and on the upper surface of a portion of the insulating film 25 surrounding the cavity 25A. The top electrode 23 is opposite to the bottom electrode 21 with the dielectric film 22 interposed therebetween. The bottom electrode 21, the dielectric film 22, and the top electrode 23 constitute a capacitor having a metal-insulator-metal (MIM) structure.

A bottom-electrode extended wiring 26 is disposed in the cavity 22A and on the upper surface of a portion of the insulating film 25 surrounding the cavity 22A. The bottom-electrode extended wiring 26 is connected to the bottom electrode 21.

Examples of the substrate 20 may include an amorphous substrate (glass substrate) mainly containing silicon oxide and a ceramic substrate mainly containing silicon nitride, aluminum oxide, boron nitride, or hafnium oxide. Such a main constituent can be a specific material constituting 50% or more of the substrate by weight.

Other examples of the substrate 20 may be a silicon substrate having a silicon oxide layer formed by a surface of the silicon substrate being thermally oxidized and a GaAs substrate having an oxide insulator film or a nitride insulator film formed on a surface of the GaAs substrate. The oxide insulator film and the nitride insulator film can be formed by using, for example, a chemical vapor deposition (CVD) method.

Examples of a material used for the dielectric film 22 may include an insulating material mainly containing silicon oxide or silicon nitride. Examples of a material used for the bottom electrode 21, the top electrode 23, and the bottom-electrode extended wiring 26 are Cu, Au, and a metal mainly containing Cu or Au. Examples of a material used for the insulating film 25 include an organic insulating material (insulating resin) such as epoxy or polyimide.

Next, advantageous effects of the first embodiment will be described.

In the passive component according to the first embodiment, an electric current flows, in the bottom electrode 21, from an area where the bottom electrode 21 is in contact with the bottom-electrode extended wiring 26 to a region immediately below the top electrode 23 or flows in the reverse direction. When the bottom electrode 21 is thin, the Q value of the capacitor is decreased by the electrical resistance of the bottom electrode 21. In the first embodiment, because a portion of the bottom electrode 21 fills the recess 20A, the bottom electrode 21 has a thickness larger than the thickness of a bottom electrode in a configuration without the recess 20A. Thus, the resistance of the bottom electrode 21 is reduced, and the Q value of the capacitor can thereby be increased.

When a thick bottom electrode 21 is disposed on the upper surface of the substrate 20 without the recess 20A being formed, the height of a step formed due to the sides of the bottom electrode 21 is increased. If the height of such a step is increased, thermal stress is likely to be concentrated at a portion of the dielectric film 22 positioned at an edge portion of the bottom electrode 21. Such concentration of thermal stress may produce a crack in the dielectric film 22. If the dielectric film 22 has such a crack, the electrostatic capacity of the capacitor varies. In addition, when the height of the step of the sides of the bottom electrode 21 is increased, the covering properties (coverage) of the dielectric film 22 is reduced. Such coverage reduction may reduce moisture resistance.

In the first embodiment, a lower portion of the bottom electrode 21 is disposed in the recess 20A, and the height of a step formed from the upper surface of the substrate 20 to the upper surface of the bottom electrode 21 is thereby reduced. Thus, the concentration of thermal stress at the edge portion of the bottom electrode 21 can be reduced, and the coverage of the dielectric film 22 can be suppressed from being reduced.

Next, preferred ranges of the dimensions of the bottom electrode 21 and the dielectric film 22 will be described.

A height direction is defined as a direction perpendicular to the upper surface of the substrate 20. The dimension of the bottom electrode 21 in the height direction is referred to as a dimension h1, and the dimension of the dielectric film 22 in the height direction is referred to as a dimension h2. In the first embodiment, because the lowermost surface of the dielectric film 22 is in contact with the upper surface of the substrate 20, the dimension h2 is equal to the height from the upper surface of the substrate 20 to the uppermost position of the dielectric film 22, that is, to the upper surface of a portion of the dielectric film 22 disposed on the upper surface of the bottom electrode 21. The dimension h1 is preferably larger than the dimension h2 to suppress cracking from occurring and to suppress the electrical resistance of the bottom electrode 21 from increasing.

By using an insulating material mainly containing silicon oxide or silicon nitride for the substrate 20, a capacitor having favorable high-frequency characteristics can be obtained because silicon oxide and silicon nitride have high insulating properties. A ceramic mainly containing silicon nitride has a thermal conductivity higher than the thermal conductivity of amorphous silicon oxide. By such a ceramic mainly containing silicon nitride being used for the substrate 20, heat dissipation performance can be enhanced. Thus, when plural passive elements are integrated on or in the single substrate 20, high integration can be achieved while sufficient heat dissipation performance is ensured.

In addition, the substrate 20 and the dielectric film 22 are preferably made of insulating materials mainly containing the same constituent. When the substrate 20 and the dielectric film 22 are made of insulating materials mainly containing the same constituent, thermal stress can be suppressed from being generated because a difference in coefficient of linear expansion between the substrate 20 and the dielectric film 22 is decreased.

When Cu or Au that is a material having a high electrical conductivity is used for the bottom electrode 21, the electrical resistance of the bottom electrode 21 is reduced. In addition, the bottom electrode 21 can be easily made thick because the bottom electrode 21 made of Cu or Au can be formed by electroplating.

Next, passive components according to modifications of the first embodiment will be described with reference to FIGS. 2A to 3C. FIGS. 2A to 3C are sectional views of the passive components according to the modifications of the first embodiment.

Figure 2A:
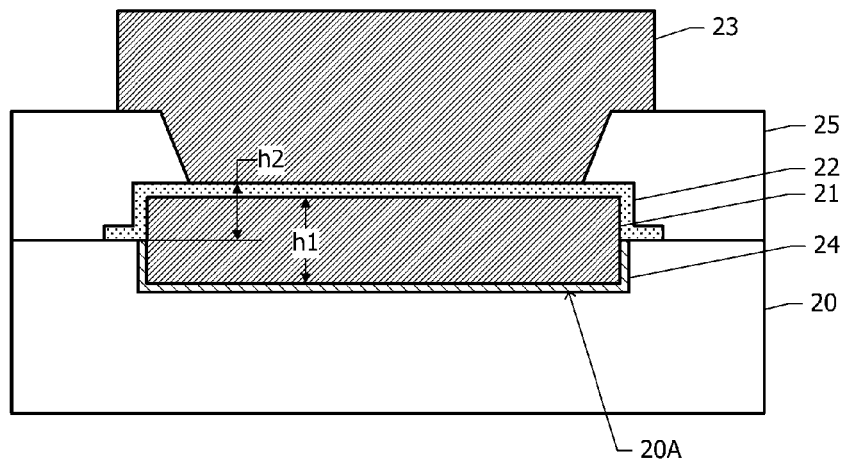
FIGS. 2A, 2B, and 2C are sectional views of passive components according to modifications of the first embodiment.

In the modification illustrated in FIG. 2A, an underlying metal layer 24 is disposed between the bottom electrode 21 and the substrate 20. The underlying metal layer 24 is made of Ti, an alloy containing Ti, Ta, an alloy containing Ta, Ni, an alloy containing Ni, Zr, or an alloy containing Zr. By the underlying metal layer 24 being disposed, the close contact of the bottom electrode 21 with the substrate 20 can be enhanced. Moreover, heat can be suppressed from diffusing from a metal constituting the bottom electrode 21 into the substrate 20. Thus, the quality of the capacitor can be enhanced.

Figure 2B:
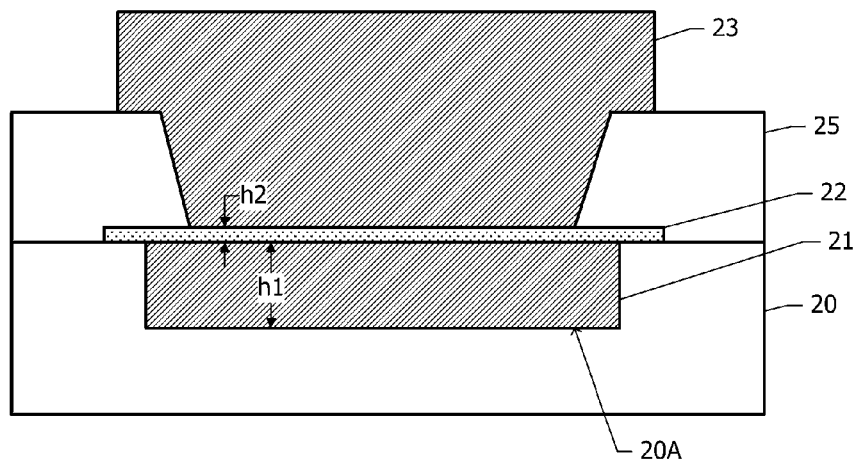

In the modification illustrated in FIG. 2B, the upper surface of the bottom electrode 21 and the upper surface of the substrate 20 are substantially flush with one another. Thus, the surface that underlies the dielectric film 22 and on which the dielectric film 22 is disposed is substantially flat. In this case, the dimension h2 of the dielectric film 22 in the height direction is equal to the thickness of the dielectric film 22 itself. In the present modification, there is no step formed between the bottom electrode 21 and the substrate 20, and it is thereby possible to further enhance the effect of reducing the concentration of thermal stress and the effect of suppressing the coverage of the dielectric film 22 from being reduced.

Note that the upper surface of the bottom electrode 21 and the upper surface of the substrate 20 are not necessarily exactly flush with one another. When a difference in height between the upper surface of the bottom electrode 21 and the upper surface of the substrate 20 is smaller than the thickness of the dielectric film 22 disposed on the upper surface of the bottom electrode 21, it is possible to obtain a sufficient effect of reducing the concentration of thermal stress and a sufficient effect of suppressing the coverage of the dielectric film 22 from being reduced.

Figure 2C:
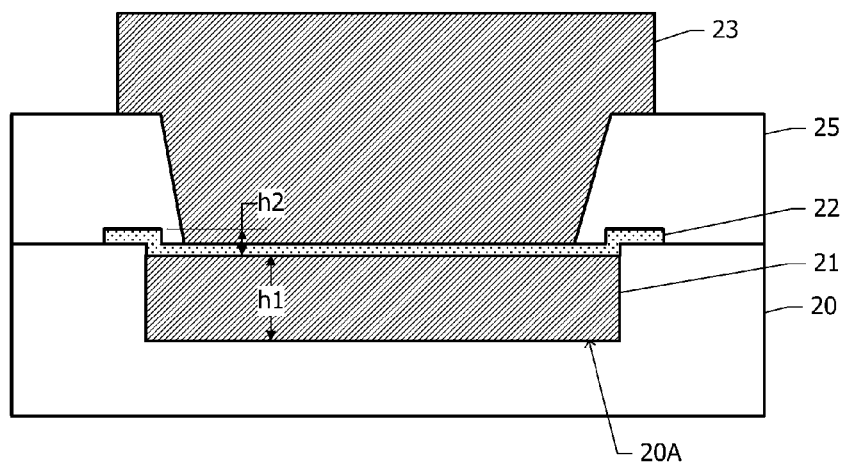

In the modification illustrated in FIG. 2C, the upper surface of the bottom electrode 21 is positioned lower than the upper surface of the substrate 20. That is, the bottom electrode 21 fills a portion of the recess 20A. The dielectric film 22 covers the upper surface of the bottom electrode 21, a region of each side of the recess 20A positioned higher than the upper surface of the bottom electrode 21, and a portion of the upper surface of the substrate 20 surrounding the recess 20A. In this case, the dimension h2 of the dielectric film 22 in the height direction is equal to the distance from the upper surface of the bottom electrode 21 to the upper surface of a portion of the dielectric film 22 covering the upper surface of the substrate 20. In the present modification, the dimension h1 is also larger than the dimension h2. Thus, it is possible to obtain the effect of reducing the concentration of thermal stress and the effect of suppressing the coverage of the dielectric film 22 from being reduced.

Figure 3A:
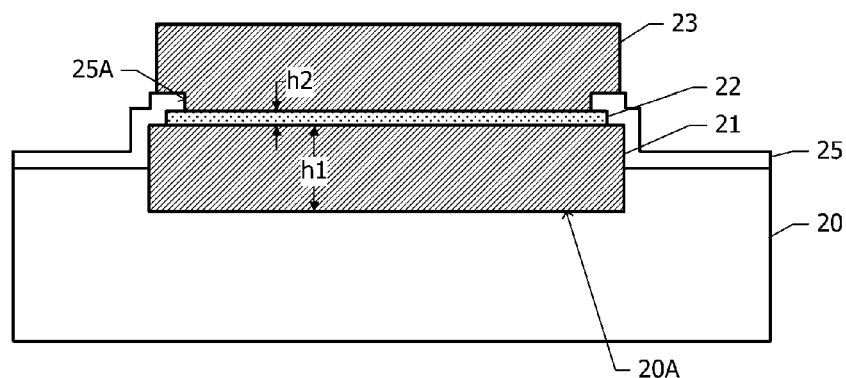
FIGS. 3A, 3B, and 3C are sectional views of passive components according to modifications of the first embodiment.
Figure 3B:
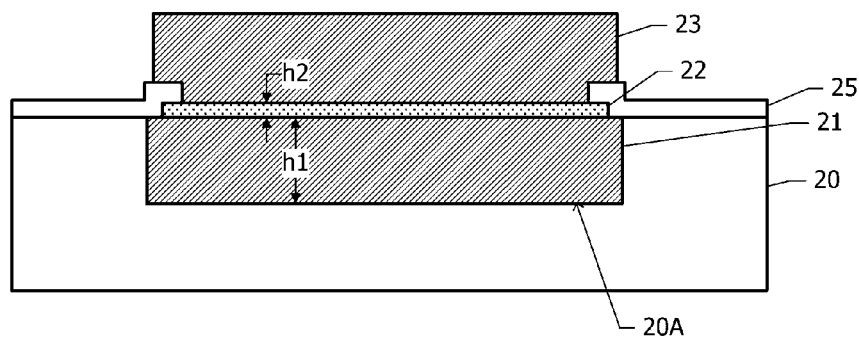
Figure 3C:
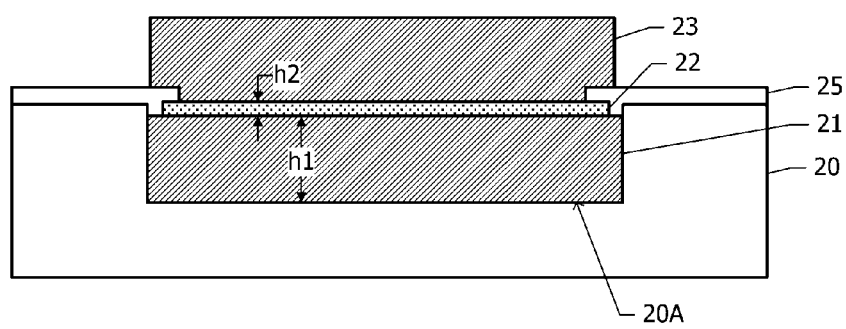

In the modifications illustrated in FIGS. 3A, 3B, and 3C, the dielectric film 22 is positioned within the bottom electrode 21 in plan view. That is, the dielectric film 22 is disposed on the upper surface of the bottom electrode 21 but does not reach the sides of the bottom electrode 21 and the sides of the recess 20A. In the modification illustrated in FIG. 3A, the upper surface of the bottom electrode 21 is positioned higher than the upper surface of the substrate 20. In the modification illustrated in FIG. 3B, the upper surface of the bottom electrode 21 and the upper surface of the substrate 20 are substantially flush with one another. In the modification illustrated in FIG. 3C, the upper surface of the bottom electrode 21 is positioned lower than the upper surface of the substrate 20.

In the modifications, the dielectric film 22 is disposed on a flat upper surface of the bottom electrode 21 and does not reach the edges of the upper surface. Thus, the dimension h2 of the dielectric film 22 in the height direction is equal to the thickness of the dielectric film 22 itself, and the dimension h1 of the bottom electrode 21 in the height direction is equal to the thickness of the bottom electrode 21 itself.

In the first embodiment, an organic insulating material is used for the insulating film 25 (FIGS. 1B and 1C), and the upper surface of the insulating film 25 is flattened. In contrast, in the modifications illustrated in FIGS. 3A, 3B, and 3C, an inorganic insulating material such as silicon nitride is used for the insulating film 25, and the upper surface of the insulating film 25 is not flattened. A region of a surface of the bottom electrode 21 not being covered with the dielectric film 22 is covered with the insulating film 25 made of an inorganic insulating material, and sufficient moisture resistance can thereby be ensured.

In the modifications illustrated in FIGS. 3A, 3B, and 3C, thermal stress is not concentrated at a portion of the dielectric film 22 positioned at an edge portion of the bottom electrode 21 because the dielectric film 22 is not disposed on such an edge portion of the bottom electrode 21. Thus, the variations in capacitance due to cracking of the dielectric film 22 is not caused. In addition, even if the bottom electrode 21 is made thick, the height of a step that appears at the sides of the bottom electrode 21 or the sides of the recess 20A is small compared with the configuration without the recess 20A, because the entire bottom electrode 21 or at least a portion of the bottom electrode 21 fills the recess 20A formed in the substrate 20. Thus, the coverage of the insulating film 25 can be suppressed from being reduced. Because it is possible to suppress the coverage of the insulating film 25 from being reduced and possible to make the bottom electrode 21 thick, the electrical resistance of the bottom electrode 21 can thereby be reduced. As a result, the Q value of the capacitor can be increased.

Second Embodiment

Next, a passive component according to a second embodiment will be described with reference to FIGS. 4A to 11C. Although the substrate 20 has a single capacitor in each of the first embodiment and the modifications of the first embodiment described with reference to FIGS. 1A to 3C, a single substrate has plural passive elements such as a capacitor and an inductor in the second embodiment.

Figure 4A:
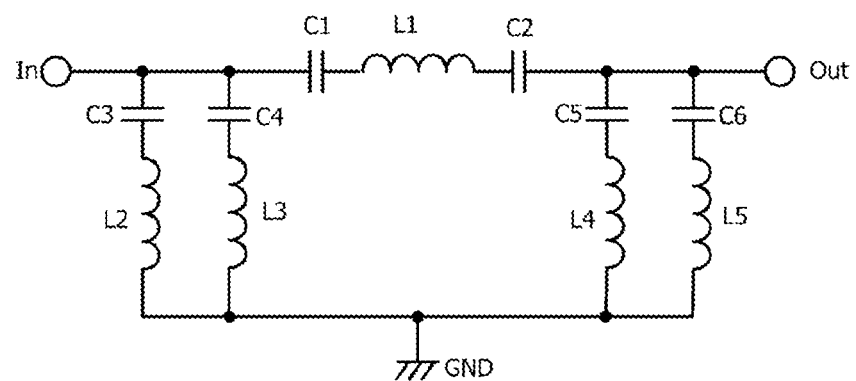
FIG. 4A is an equivalent circuit diagram of an integrated type passive component according to a second embodiment.

FIG. 4A is an equivalent circuit diagram of an integrated type passive component according to the second embodiment. The passive component according to the second embodiment is a band pass filter including six capacitors and five inductors. Between an input terminal In and an output terminal Out, in order from the input terminal In side, a capacitor C1, an inductor L1, and a capacitor C2 are connected in series to one another. Between the input terminal In and a ground terminal GND, a series circuit of a capacitor C3 and an inductor L2 and a series circuit of a capacitor C4 and an inductor L3 are connected in parallel to one another. Between the output terminal Out and the ground terminal GND, a series circuit of a capacitor C5 and an inductor L4 and a series circuit of a capacitor C6 and an inductor L5 are connected in parallel to one another.

Figure 4B:
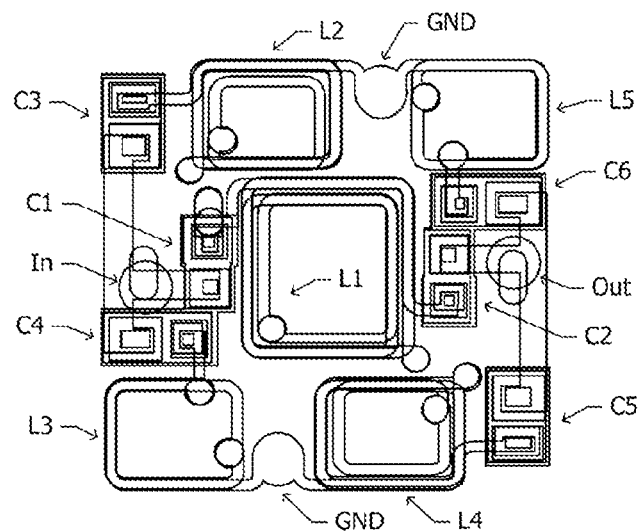
FIG. 4B illustrates, in plan view, the positional relationship of plural passive elements included in the integrated type passive component according to the second embodiment.

FIG. 4B illustrates, in plan view, the positional relationship of the plural passive elements included in the passive component according to the second embodiment. The six capacitors C1 to C6, the five inductors L1 to L5, the input terminal In, the output terminal Out, and two ground terminals GND are arranged on the substrate. Such passive elements are constituted by the conductor patterns included in plural wiring layers disposed on the substrate. FIG. 4B illustrates the conductor patterns, which are included in the respective wiring layers, layered on one another without being distinguished by their wiring layers.

Figure 5:
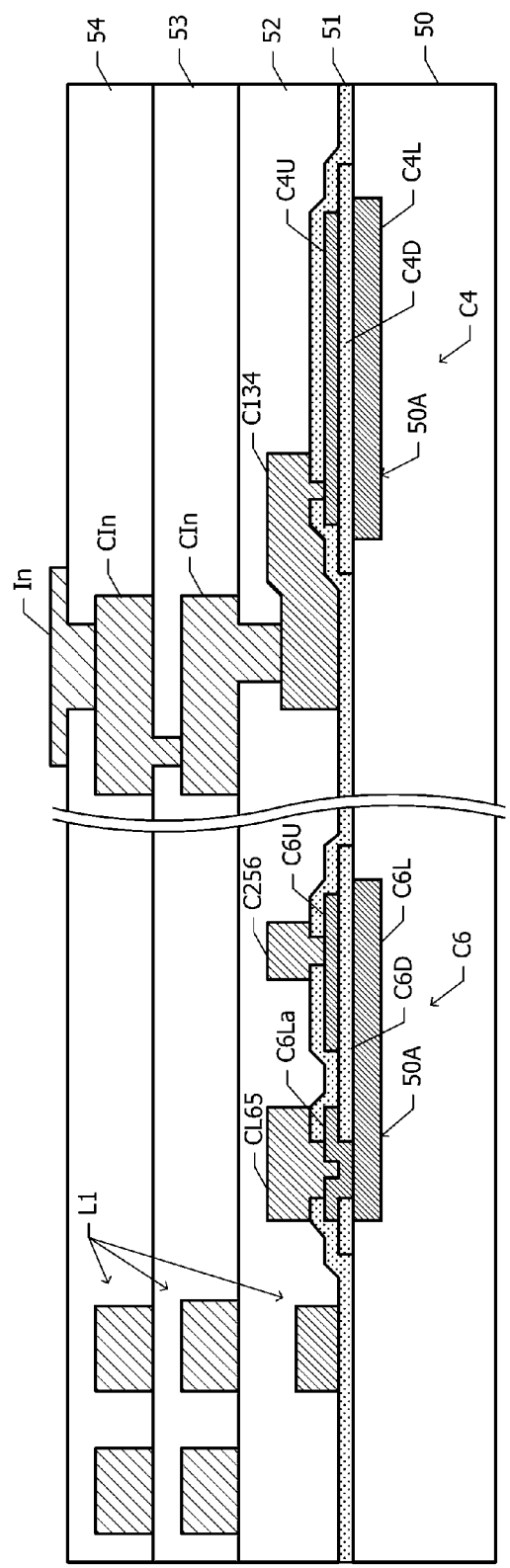
FIG. 5 is a sectional view of regions including capacitors C4 and C6 of the passive component according to the second embodiment and the vicinity of each region.

FIG. 5 is a sectional view of regions including the capacitors C4 and C6 and the vicinity of each region. Plural recesses 50A are formed in the upper surface of a substrate 50 having insulating properties. Examples of the substrate 50 include a ceramic substrate mainly containing, for example, silicon nitride, aluminum oxide, aluminum nitride, boron nitride, or hafnium oxide and a glass substrate mainly containing silicon oxide. In addition to the examples, a composite substrate made of a semiconductor material and an insulating material may also be used. Examples of such a composite substrate may include a Si substrate having an oxide insulator film formed by a surface of the Si substrate being thermally oxidized and a semiconductor substrate, such as a GaAs substrate, having an oxide insulator film or a nitride insulator film formed on a surface of the semiconductor substrate by using the chemical vapor deposition (CVD) method or other methods. For the substrate 50 of the passive component for high frequency, a material having particularly high insulating properties such as silicon oxide or silicon nitride is preferably used. In addition, because having a high thermal conductivity, silicon nitride is suitably used when a large power is applied to a passive element. The thickness of the substrate 50 is determined based on, for example, a desired height of the passive component and is selected from the range of, for example, 50 μm or more and 300 μm or less (i.e., from 50 μm to 300 μm).

Two recesses 50A are illustrated in FIG. 5, one of the recesses 50A is filled with a bottom electrode C4L of the capacitor C4, and the other recess 50A is filled with a bottom electrode C6L of the capacitor C6. As with the modification of the first embodiment illustrated in FIG. 2B, the upper surfaces of the bottom electrodes C4L and C6L are substantially flush with the upper surface of the substrate 50.

Examples of a material used for the bottom electrodes C4L and C6L include a material having a high electrical conductivity, such as Al, Au, or Cu or an alloy containing such metals for increasing a Q value. A close contact layer for enhancing close contact or a diffusion-preventing layer for preventing diffusion may be disposed between the substrate 50 and, for example, the bottom electrodes C4L and C6L. Examples of a material used for the close contact layer and the diffusion-preventing layer include a high melting point metal and an alloy containing a high melting point metal. Examples of such a high melting point metal used for the close contact layer and the diffusion-preventing layer are Ti, Ni, W, and Ta.

Dielectric films C4D and C6D are disposed so as to cover the upper surfaces of the respective bottom electrodes C4L and C6L. Examples of a material used for the dielectric films C4D and C6D include an inorganic insulating material mainly containing, for example, silicon nitride, silicon oxide, aluminum oxide, aluminum nitride, or tantalum oxide. Note that a difference in coefficient of linear expansion between the substrate 50 and, for example, the dielectric films C4D and C6D is preferably decreased to reduce the concentration of thermal stress. The dielectric films C4D and C6D, for example, and the substrate 50 are preferably made of insulating materials mainly containing the same constituent to decrease such a difference in coefficient of linear expansion therebetween. The thickness of each of the dielectric films C4D and C6D is determined in view of, for example, desired capacitance, voltage resistance, and moisture resistance and is selected from the range of, for example, 30 nm or more and 500 nm or less (i.e., from 30 nm to 500 nm).

In plan view, the bottom electrodes C4L and C6L are positioned within the regions surrounded by the outer contour lines of the respective dielectric films C4D and C6D. That is, each of the positional relationship between the bottom electrode C4L and the dielectric film C4D and the positional relationship between the bottom electrode C6L and the dielectric film C6D is identical with the positional relationship between the bottom electrode 21 and the dielectric film 22 illustrated in FIG. 2B. Note that the positional relationship between the bottom electrode 21 and the dielectric film 22 illustrated in any one of FIGS. 1B, 2A, 2C, 3A, 3B, and 3C may also be applied to the positional relationships between the bottom electrode C4L and the dielectric film C4D and between the bottom electrode C6L and the dielectric film C6D.

A top electrode C4U is disposed on the dielectric film C4D. A top electrode C6U is disposed on the dielectric film C6D. A bottom-electrode extended wiring C6La is further disposed in a region where the bottom-electrode extended wiring C6La overlaps the bottom electrode C6L in plan view. The bottom-electrode extended wiring C6La passes through a cavity formed in the dielectric film C6D and is connected to the bottom electrode C6L. For the top electrodes C4U and C6U, and the bottom-electrode extended wiring C6La, the same metal material as the metal material used for the bottom electrodes C4L and C6L is used.

A first-layer interlayer insulating film 51 is disposed on the substrate 50 so as to cover, for example, the top electrodes C4U and C6U and the bottom-electrode extended wiring C6La. Examples of a material used for the interlayer insulating film 51 include an inorganic insulating material such as silicon nitride.

Plural metal patterns of the first-layer wiring layer are disposed on the first-layer interlayer insulating film 51. The first-layer wiring layer includes the metal patterns for wirings C134, C256, and CL65, and the inductor L1. The wiring C134 passes through a cavity formed in the interlayer insulating film 51 and is connected to the top electrode C4U. Examples of a material used for the metal patterns of the first-layer wiring layer include a material having a high electrical conductivity such as Al, Au, or Cu. Note that Cu that is relatively reasonable and enables thickening easily or an electrically conductive material mainly containing Cu is preferably used.

The wiring C134 corresponds to a wiring that connects the capacitors C1, C3, and C4 to one another in the equivalent circuit diagram illustrated in FIG. 4A. The wiring C256 passes through a cavity formed in the interlayer insulating film 51 and is connected to the top electrode C6U. The wiring C256 corresponds to a wiring that connects the capacitors C2, C5, and C6 to one another in the equivalent circuit diagram illustrated in FIG. 4A. The wiring CL65 passes through a cavity formed in the interlayer insulating film 51 and is connected to the bottom-electrode extended wiring C6La. The wiring CL65 corresponds to a wiring that connects the capacitor C6 and the inductor L5 to one another in the equivalent circuit diagram illustrated in FIG. 4A.

On the first-layer wiring layer, a second-layer interlayer insulating film 52, a second-layer wiring layer, a third-layer interlayer insulating film 53, a third-layer wiring layer, a fourth-layer interlayer insulating film 54 are laminated in this order. Both the second-layer wiring layer and the third-layer wiring layer include the metal patterns for a wiring CIn and the inductor L1. The input terminal In is disposed on the fourth-layer interlayer insulating film 54. The wiring CIn included in the second-layer and third-layer wiring layers corresponds to a wiring that connects the input terminal In to the capacitors C1, C3, and C4 in the equivalent circuit diagram illustrated in FIG. 4A. The metal patterns of the second-layer and third-layer wiring layers are made of the same material as the material used for the metal patterns of the first-layer wiring layer.

Examples of a material used for the second-layer to fourth-layer interlayer insulating films 52, 53, and 54 include an organic insulating material having a low Young's modulus, that is, for example, a resin such as epoxy or polyimide. To increase a Q value, each metal pattern constituting, for example, the inductor L1 has a thickness larger than the thickness of the electrode of each capacitor. Thus, under thermal load, thermal strain between the metal pattern constituting, for example, the inductor L1 and a corresponding one of the interlayer insulating films 52, 53, and 54 is large. The organic insulating material having a low Young's modulus is used for the interlayer insulating films 52, 53, and 54 for the purpose of reducing stress by absorbing such thermal strain. Thus, it is possible to suppress product quality from being reduced.

The upper surfaces of the second-layer to fourth-layer interlayer insulating films 52, 53, and 54 are flattened. By the upper surfaces of the interlayer insulating films 52, 53, and 54 being flattened, each of the metal patterns of the wiring layers disposed on the upper surfaces of the interlayer insulating films 52, 53, and 54 can be made fine and can have a high aspect ratio.

To bring the coefficient of linear expansion of each of the interlayer insulating films 52, 53, and 54 close to the coefficient of linear expansion of the substrate 50, an inorganic material may be mixed in the organic insulating material constituting the interlayer insulating films 52, 53, and 54. A close contact layer may be disposed between the metal pattern and the interlayer insulating film for the purpose of enhancing close contact between the metal pattern of each wiring layer and the corresponding interlayer insulating film of resin disposed below the metal pattern. Examples of a material used for such a close contact layer may include Ti, TiW, and Ni. In addition, a surface roughening treatment of the metal pattern such as a CZ treatment may be performed to enhance close contact between the metal pattern and the corresponding interlayer insulating film of resin disposed above the metal pattern.

Examples of a material used for, for example, the input terminal In include a material having a high electrical conductivity such as Cu, Al, or Au. A surface of, for example, the input terminal In may be covered with an antioxidant film of, for example, NiAu or NiPdAu to ensure solder connection with an external circuit. In addition, a solder layer of, for example, NiSn or NiSnAg may be disposed on the upper surface of, for example, the input terminal In.

Next, the shapes of the electrodes of the capacitors and the metal patterns disposed in the respective wiring layers, and the positional relationship therebetween will be described with reference to FIGS. 6A to 8B.

Figure 6A:
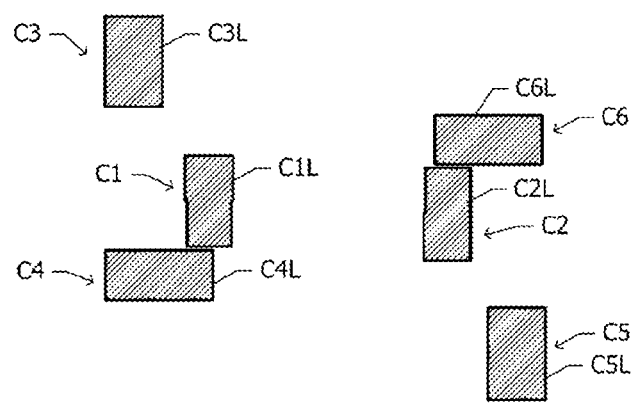
FIG. 6A is a plan view of a bottom electrode filling a recess of a substrate.

FIG. 6A is a plan view of a bottom electrode filling the corresponding recess 50A of the substrate 50 (FIG. 5). Bottom electrodes C1L, C2L, C3L, C4L, C5L, and C6L of the respective capacitors C1, C2, C3, C4, C5, and C6 are arranged.

Figure 6B:
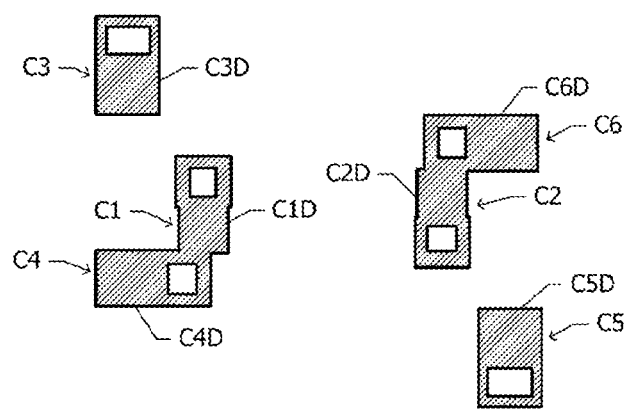
FIG. 6B is a plan view of dielectric films of six capacitors.

FIG. 6B is a plan view of dielectric films of the six capacitors. Dielectric films C1D, C2D, C3D, C4D, C5D, and C6D are disposed at positions where the dielectric films C1D to C6D overlap the respective bottom electrodes C1L, C2L, C3L, C4L, C5L, and C6L (FIG. 6A) of the capacitors C1, C2, C3, C4, C5, and C6. Each of the dielectric films C1D, C2D, C3D, C4D, C5D, and C6D has a cavity through which a wiring is extended from the corresponding bottom electrode. The dielectric film C1D is formed continuously from the dielectric film C4D, and the dielectric film C2D is formed continuously from the dielectric film C6D.

Figure 7A:
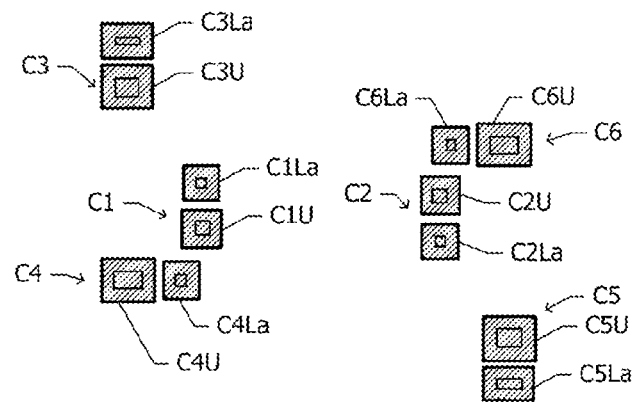
FIG. 7A is a plan view of top electrodes and bottom-electrode extended wirings of the six capacitors.

FIG. 7A is a plan view of top electrodes and bottom-electrode extended wirings of the six capacitors. In plan view, bottom-electrode extended wirings C1La, C2La, C3La, C4La, C5La, and C6La are disposed at positions where the bottom-electrode extended wirings C1La to C6La overlap the cavities formed in the respective dielectric films C1D, C2D, C3D, C4D, C5D, and C6D (FIG. 6B). The bottom-electrode extended wirings C1La, C2La, C3La, C4La, C5La, and C6La are connected to the bottom electrodes C1L, C2L, C3L, C4L, C5L, and C6L (FIG. 6A), respectively.

Moreover, in plan view, top electrodes C1U, C2U, C3U, C4U, C5U, and C6U are disposed at position where the top electrodes C1U to C6U overlap the respective dielectric films C1D, C2D, C3D, C4D, C5D, and C6D (FIG. 6B). The capacitors C1, C2, C3, C4, C5, and C6 are constituted by the respective top electrodes C1U, C2U, C3U, C4U, C5U, and C6U and the respective bottom electrodes C1L, C2L, C3L, C4L, C5L, and C6L (FIG. 6A) disposed below the top electrodes.

Figure 7B:
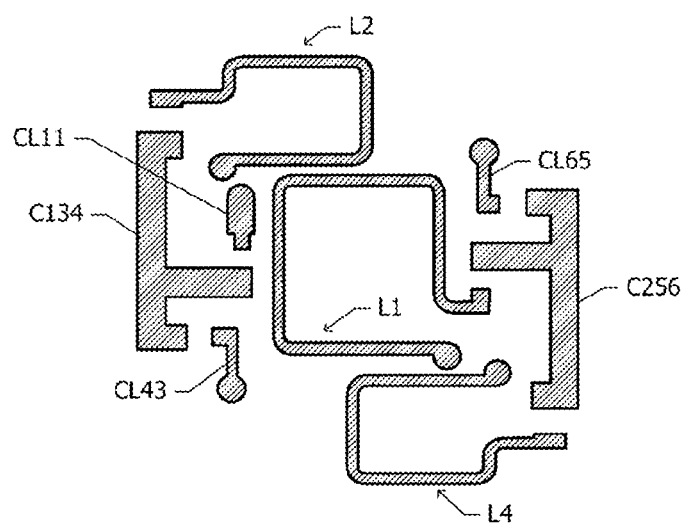
FIG. 7B is a plan view of a metal pattern included in a first-layer wiring layer.

FIG. 7B is a plan view of plural metal patterns included in the first-layer wiring layer. Three metal patterns constituting the respective inductors L1, L2, and L4 are arranged. One end of the metal pattern constituting the inductor L1 is connected to the bottom-electrode extended wiring C2La (FIG. 7A). One end of the metal pattern constituting the inductor L2 is connected to the bottom-electrode extended wiring C3La (FIG. 7A). One end of the metal pattern constituting the inductor L4 is connected to the bottom-electrode extended wiring C5La (FIG. 7A).

The wirings C134, C256, CL11, CL43, and CL65 are further disposed in the first-layer wiring layer. The wiring C134 connects the top electrodes C1U, C3U, and C4U (FIG. 7A) to one another. The wiring C256 connects the top electrodes C2U, C5U, and C6U (FIG. 7A) to one another.

The wirings CL11, CL43, and CL65 are connected to the bottom-electrode extended wirings C1La, C4La, and C6La (FIG. 7A), respectively.

Figure 8A:
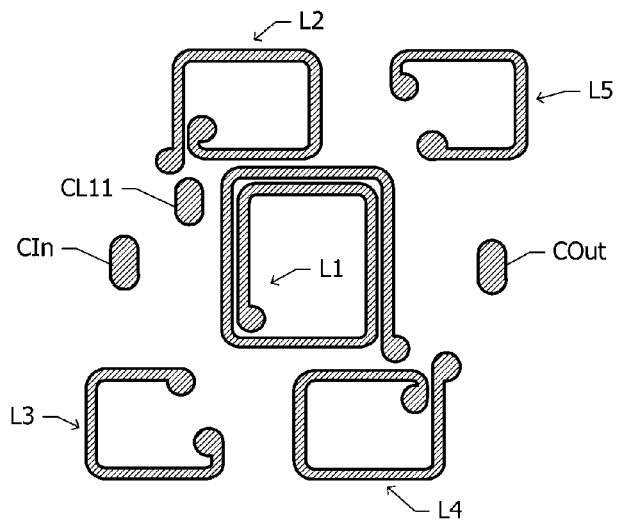
FIG. 8A is a plan view of a meal pattern included in a second-layer wiring layer.

FIG. 8A is a plan view of plural metal patterns included in the second-layer wiring layer. The metal patterns constituting the respective inductors L1, L2, L3, L4, and L5 are arranged. One end of the metal pattern constituting each of the inductors L1, L2, and L4 is connected to the metal pattern constituting a corresponding one of the inductors L1, L2, and L4 included in the first-layer wiring layer (FIG. 7B). One end of the metal pattern constituting the inductor L3 is connected to the bottom-electrode extended wiring C4La (FIG. 7A) with the wiring CL43 (FIG. 7B), which is included in the wiring layer below the metal pattern, interposed therebetween. One end of the metal pattern constituting the inductor L5 is connected to the bottom-electrode extended wiring C6La (FIG. 7A) with the wiring CL65 (FIG. 7B) included in the wiring layer below the metal pattern interposed therebetween.

The wirings CL11 and CIn and a wiring COut are further disposed in the second-layer wiring layer. The wirings CL11, CIn, and COut are connected to the wirings CL11, C134, and C256 of the first-layer wiring layer, respectively.

Figure 8B:
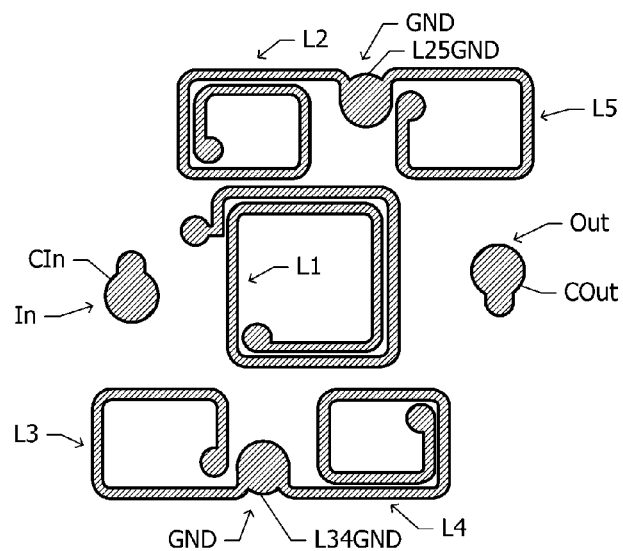
FIG. 8B is a plan view of a metal pattern included in a third-layer wiring layer.

FIG. 8B is a plan view of plural metal patterns included in the third-layer wiring layer. The metal patterns constituting the respective inductors L1, L2, L3, L4, and L5, an input-terminal pad CIn, an output-terminal pad COut, ground pads L25GND and L34GND are arranged. One end of the metal pattern constituting the inductor L1 is connected to the metal pattern constituting the inductor L1 in the second-layer wiring layer (FIG. 8A), and the other end thereof is connected to the bottom-electrode extended wiring C1La (FIG. 7A) with the wirings CL11 of the second-layer and first-layer wiring layers (FIGS. 8A and 7B) interposed therebetween.

One end of the metal pattern constituting the inductor L2 is connected to the metal pattern constituting the inductor L2 in the second-layer wiring layer (FIG. 8A), and the other end thereof is formed continuously from the ground pad L25GND. One end of the metal pattern constituting the inductor L5 is connected to the metal pattern constituting the inductor L5 in the second-layer wiring layer (FIG. 8A), and the other end thereof is formed continuously from the ground pad L25GND.

One end of the metal pattern constituting the inductor L3 is connected to the metal pattern constituting the inductor L3 in the second-layer wiring layer (FIG. 8A), and the other end thereof is formed continuously from the ground pad L34GND. One end of the metal pattern constituting the inductor L4 is connected to the metal pattern constituting the inductor L4 in the second-layer wiring layer (FIG. 8A), and the other end thereof is formed continuously from the ground pad L34GND.

The input-terminal pad CIn is connected to the wiring C134 of the first-layer wiring layer (FIG. 7B) with the wiring CIn of the second-layer wiring layer (FIG. 8A) interposed therebetween. The output-terminal pad COut is connected to the wiring C256 of the first-layer wiring layer (FIG. 7B) with the wiring COut of the second-layer wiring layer (FIG. 8A) interposed therebetween. The input terminal In (FIGS. 4A and 5) is disposed on the input-terminal pad CIn, and the output terminal Out (FIG. 4A) is disposed on the output-terminal pad COut. The ground terminals GND (FIG. 4A) are disposed on the respective ground pads L25GND and L34GND.

As FIGS. 7B to 8B illustrate, each of the inductors L1, L2, L3, L4, and L5 is constituted by the metal patterns disposed in the plural wiring layers.

Next, a method for manufacturing the passive component according to the second embodiment will be described with reference to FIGS. 9A to 11C. FIGS. 9A to 11C are sectional views of the passive component, in the middle of manufacturing, according to the second embodiment. In the following description, although a production procedure of the constituent elements illustrated in the sectional views of FIGS. 9A to 11C will be described, constituent elements not being illustrated in the sectional views are produced in a similar procedure.

As FIG. 9A illustrates, plural recesses 50A are formed in the upper surface of the substrate 50. For example, a region in which no recesses 50A are formed is masked with a resist pattern, and a surface layer portion of the substrate 50 is subjected to etching to form the recesses 50A. Examples of such etching may include a dry etching process such as reactive ion etching (RIE) or inductively coupled plasma (ICP) etching and a wet etching process with chemicals. Note that it is also possible to perform an etching process, without using a resist pattern, by using a photosensitive glass material for the substrate 50.

As FIG. 9B illustrates, the recesses 50A are filled with a metal film 61 by the metal film 61 being deposited on the substrate 50. Hereinafter, a deposition procedure of the metal film 61 will be described in a specific manner.

First, a close contact layer made of, for example, TiW is formed, and a Cu coating is formed on the close contact layer. The close contact layer and the Cu coating may be formed by using, for example, a sputtering method. The Cu coating is used as an electrode, and electroplating with Cu is performed to form the metal film 61.

As FIG. 9C illustrates, a portion of the metal film 61 (FIG. 9B) other than portions of the metal film 61 filling the recesses 50A is removed. The portion of the metal film 61 can be removed by, for example, chemical polishing, mechanical polishing, and chemical mechanical polishing (CMP). Due to the removal, the bottom electrodes C4L and C6L constituted by the metal film 61 are left in the recesses 50A. In addition, the upper surfaces of the bottom electrodes C4L and C6L are substantially flush with the upper surface of the substrate 50. Note that, depending on polishing conditions, the upper surfaces of the bottom electrodes C4L and C6L may be positioned slightly higher than the upper surface of the substrate 50 (corresponding to the state illustrated in FIG. 1B), or the upper surfaces of the bottom electrodes C4L and C6L may be positioned slightly lower than the upper surface of the substrate 50 (corresponding to the state illustrated in FIG. 2C).

As FIG. 10A illustrates, the dielectric films C4D and C6D each having a cavity are formed on the bottom electrodes C4L and C6L, respectively. The dielectric films can be formed by using a plasma-enhanced chemical vapor deposition (PE-CVD) method. The dielectric films can be patterned by the reactive ion etching (RIE). Note that a portion of the dielectric film other than cavities may be left on the entire substrate if there are no difficulties in view of the design of a component.

As FIG. 10B illustrates, the top electrode C4U is formed on the dielectric film C4D, and the top electrode C6U and the bottom-electrode extended wiring C6La are formed on the dielectric film C6D. Such metal films can be formed by using a vacuum deposition method. For example, a Ti film having a thickness of 50 nm is formed, and an Au film having a thickness of 100 nm is formed on the Ti film. Such metal films are patterned by using a lift-off method.

As FIG. 10C illustrates, the interlayer insulating film 51 is formed on the substrate 50 so as to cover the top electrodes C4U and C6U and the bottom-electrode extended wiring C6La. The interlayer insulating film 51 is formed by using the PE-CVD method.

As FIG. 11A illustrates, plural cavities 51H are formed in required portions of the interlayer insulating film 51. The cavities 51H are formed by dry etching such as photolithography or the RIE.

As FIG. 11B illustrates, the metal patterns of the wirings C134, C256, and CL65 and the inductor L1 of the first-layer wiring layer are formed on the interlayer insulating film 51. Hereinafter, a procedure for forming a metal pattern will be described.

First, a multilayer coating of a Ti film and a Cu film is formed on the entire substrate 50 by using the sputtering method. Subsequently, a region on which no metal pattern is disposed is covered with a resist pattern. The multilayer coating is used as a seed layer, and electroplating with Cu is performed. The resist pattern is then removed by using an organic solvent, and an exposed portion of the multilayer coating is removed by wet etching.

As FIG. 11C illustrates, the interlayer insulating film 52 is formed on the entire substrate. Hereinafter, a procedure for forming the interlayer insulating film 52 will be described.

First, a B-stage epoxy resin film into which a photosensitive material is mixed is laminated by using a vacuum lamination method. A cavity is formed in a required portion of the epoxy resin film by performing development with an alkali solution after a photolithography process. Subsequently, the B-stage epoxy resin film is cured by heat treatment.

The wiring layer and the interlayer insulating film are formed repeatedly to form, for example, the second-layer and third-layer wiring layers (FIG. 5), the third-layer and fourth-layer interlayer insulating films 53 and 54 (FIG. 5), and the input terminal In (FIG. 5). After the input terminal In is formed, an antioxidant film made of NiAu is formed on the surface of the terminal by electroless plating. Moreover, the substrate 50 is ground, from the lower surface thereof, down to a required thickness by using a back grinding method. Finally, the substrate 50 is cut, with a dicing machine, into individual passive components according to the second embodiment.

Next, advantageous effects of the second embodiment will be described.

Each of the capacitors C1, C2, C3, C4, C5, and C6 of the passive component according to the second embodiment has the same structure as the structure of the capacitor according to the first embodiment or according to a corresponding one of the modifications of the first embodiment described with reference to FIGS. 1A to 3C. Thus, in the second embodiment, as with the first embodiment, the Q value of the capacitor can also be increased, and the coverage of the dielectric film can also be suppressed from being reduced.

Next, a modification of the second embodiment will be described.

Although the three wiring layers constitute, for example, the inductor L1 in the second embodiment (FIG. 5), the number of the wiring layers may be any number other than three depending on a circuit configuration that the passive component is required to have. After the wiring C134 and other elements of the first-layer wiring layer are formed and before the second-layer interlayer insulating film 52 is formed, the entire surface underlying the second-layer interlayer insulating film 52 may be covered with a coating made of an inorganic insulating material such as silicon nitride. The coating can improve moisture resistance, and the environmental resistance of the capacitor can thereby be further enhanced.

Third Embodiment

Next, a passive component according to a third embodiment will be described with reference to FIGS. 12A and 12B. Hereinafter, the description of a configuration common to the passive component according to the second embodiment described with reference to FIGS. 4A to 11C is not repeated.

FIG. 12A is a sectional view of a substrate 50 used for the passive component according to the third embodiment.

The substrate 50 used for the passive component according to the third embodiment has a first interface 50B formed by different materials being contact with one another in the thick direction of the substrate 50. A base 50M positioned deeper than the first interface 50B is made of an insulating material mainly containing, for example, silicon nitride, and a surface layer 50S positioned shallower than the first interface 50B is made of an insulating material mainly containing, for example, silicon oxide.

FIG. 12B is a sectional view of the substrate 50 when a recess 50A is formed in the substrate 50. The recess 50A is recessed from the upper surface of the substrate 50 and reaches the first interface 50B. The recess 50A is formed by the surface layer 50S being etched under the etching conditions where the etching rate of the base 50M is sufficiently slower than the etching rate of the surface layer 50S. The surface layer 50S can be etched selectively over the base 50M, and controllability over processing the recess 50A can thereby be enhanced. Thus, the thickness of the bottom electrode of the capacitor can be controlled with high accuracy.

Fourth Embodiment

Next, a passive component according to a fourth embodiment will be described with reference to FIGS. 13A and 13B. Hereinafter, the description of a configuration common to the passive component according to the third embodiment described with reference to FIGS. 12A and 12B is not repeated.

FIG. 13A is a sectional view of a substrate 50 used for the passive component according to the fourth embodiment. In the fourth embodiment, the substrate 50 has a second interface 50C positioned deeper than the first interface 50B. The substrate 50 has the base 50M, the surface layer 50S, and an etch stop layer 50E disposed between the base 50M and the surface layer 50S. The interface of the base 50M and the etch stop layer 50E corresponds to the second interface 50C, and the interface of the etch stop layer 50E and the surface layer 50S corresponds to the first interface 50B.

The surface layer 50S and the etch stop layer 50E are made of insulating materials mainly containing different constituents, and the etch stop layer 50E and the base 50M are made of insulating materials mainly containing different constituents. For example, the base 50M and the surface layer 50S may be made of insulating materials mainly containing the same constituent, that is, for example, insulating materials mainly containing silicon oxide, and the etch stop layer 50E may be made of an insulating material mainly containing silicon nitride, or may be made of two or more insulating materials.

FIG. 13B is a sectional view of the substrate 50 when a recess 50A is formed therein. As the etching conditions of the surface layer 50S for forming the recess 50A, the conditions enabling the surface layer 50S to be etched selectively over the etch stop layer 50E is adopted. Under the conditions, the etching is stopped at the first interface 50B. Thus, as with the third embodiment (FIGS. 12A and 12B), the controllability over processing the recess 50A can be enhanced, and the thickness of the bottom electrode of the capacitor can be controlled with high accuracy.

The thickness of the etch stop layer 50E (i.e., the region) positioned between the first interface 50B and the second interface 50C is preferably smaller than the thickness of the surface layer 50S positioned between the upper surface of the substrate 50 and the first interface 50B. The etch stop layer 50E is made thin, and it is thereby possible to reduce thermal deformation or thermal stress caused by a difference in coefficient of linear expansion between different types of materials.

Fifth Embodiment

Next, a passive component according to a fifth embodiment will be described with reference to FIG. 14. Hereinafter, the description of a configuration common to the passive component according to the second embodiment described with reference to FIGS. 4A to 11C is not repeated.

Figure 14:
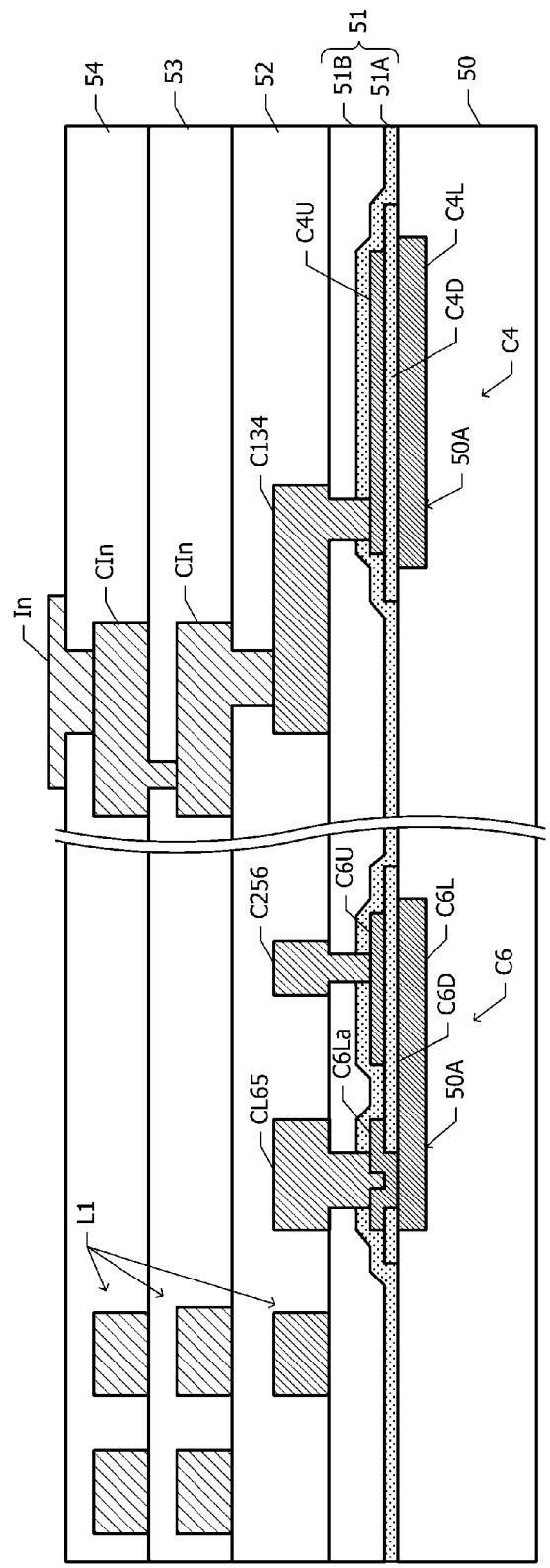
FIG. 14 is a sectional view of a passive component according to a fifth embodiment.

FIG. 14 is a sectional view of the passive component according to the fifth embodiment. Although the first-layer interlayer insulating film 51 is constituted by a single layer made of an inorganic insulating material in the second embodiment (FIG. 5), in the fifth embodiment, a first-layer interlayer insulating film 51 is constituted by two layers that are a bottom layer 51A and a top layer 51B. The bottom layer 51A is made of an inorganic insulating material mainly containing silicon nitride, and the top layer 51B is made of an organic insulating material such as epoxy or polyimide. The upper surface of the top layer 51B is flattened.

In the fifth embodiment, because the surface underlying the first-layer wiring layer is flattened, the aspect ratios of, for example, wirings C134, C256, and CL65 of the first-layer wiring layer can be increased. Moreover, sufficient moisture resistance of, for example, the capacitor can be ensured because the bottom layer 51A is made of an inorganic insulating material having high moisture resistance.

Note that each of the above-described embodiments is an example, and configurations presented in different embodiments may be partially replaced or combined. Similar actions and effects exhibited by similar configurations in plural different embodiments are not referred to, one by one, in each of the embodiments. Moreover, the present disclosure is not limited to the above-described embodiments. For example, it will be obvious to those skilled in the art that, for example, various modifications, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A passive component comprising:
a substrate having insulating properties and having an upper surface having a recess;
a bottom electrode filling at least a portion of the recess;
a dielectric film on an upper surface of the bottom electrode; and
a top electrode opposite to the bottom electrode with the dielectric film interposed therebetween, wherein,
in a height direction perpendicular to the upper surface of the substrate, a dimension of the bottom electrode is larger than a dimension of the dielectric film,
the bottom electrode protrudes above the upper surface of the substrate,
entire sides of a portion of the bottom electrode positioned above the upper surface of the substrate and the upper surface of the bottom electrode are covered with only one material, and
the substrate has a first interface configured of materials that are different and are in contact with one another in a thickness direction of the substrate, and the recess is recessed from the surface of the substrate and reaches the first interface.

2. The passive component according to claim 1, wherein in plan view, the dielectric film is positioned within the bottom electrode.

3. The passive component according to claim 2, wherein the substrate contains 50% or more by weight of silicon oxide or silicon nitride.

4. The passive component according to claim 2, wherein the dielectric film is made of an insulating material containing 50% or more by weight of a same constituent as a main constituent of the substrate.

5. The passive component according to claim 2, wherein the bottom electrode is made of a metal containing 50% or more by weight of Cu or Au.

6. The passive component according to claim 1, wherein a difference in height between the upper surface of the bottom electrode and the surface of the substrate is smaller than a thickness of the dielectric film disposed on the upper surface of the bottom electrode.

7. The passive component according to claim 6, wherein the substrate contains 50% or more by weight of silicon oxide or silicon nitride.

8. The passive component according to claim 6, wherein the dielectric film is made of an insulating material containing 50% or more by weight of a same constituent as a main constituent of the substrate.

9. The passive component according to claim 6, wherein the bottom electrode is made of a metal containing 50% or more by weight of Cu or Au.

10. The passive component according to claim 1, wherein the substrate contains 50% or more by weight of silicon oxide or silicon nitride.

11. The passive component according to claim 10, wherein
the dielectric film is made of an insulating material containing 50% or more by weight of a same constituent as a main constituent of the substrate.

12. The passive component according to claim 1, wherein the dielectric film is made of an insulating material containing 50% or more by weight of a same constituent as a main constituent of the substrate.

13. The passive component according to claim 1, wherein the material positioned above the first interface is an insulating material containing 50% or more by weight of silicon oxide, and the material positioned below the first interface is an insulating material containing 50% or more by weight of silicon nitride.

14. The passive component according to claim 1, wherein the substrate has a second interface positioned deeper than the first interface, the second interface is configured of materials that are different and are in contact with one another in the thickness direction of the substrate, a region of the substrate that is positioned between the second interface and the first interface is made of one insulating material or at least two insulating materials containing 50% or more by weight of a same constituent, and a thickness of the region between the first interface and the second interface is smaller than a region between the surface of the substrate and the first interface.

15. The passive component according to claim 14, further comprising:
an underlying metal layer disposed between the bottom electrode and the substrate, wherein
the underlying metal layer is made of Ti, an alloy containing Ti, Ta, an alloy containing Ta, Ni, an alloy containing Ni, Zr, or an alloy containing Zr.

16. The passive component according to claim 1, wherein the bottom electrode is made of a metal containing 50% or more by weight of Cu or Au.

* * * * *